(12) United States Patent
Maeda

(10) Patent No.: US 6,456,561 B2
(45) Date of Patent: Sep. 24, 2002

(54) SYNCHRONOUS SEMICONDUCTOR MEMORY DEVICE

(75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/864,243

(22) Filed: May 25, 2001

(30) Foreign Application Priority Data

May 29, 2000 (JP) ........................................ 2000-158099

(51) Int. Cl.[7] ................................................. G11C 8/00
(52) U.S. Cl. ............. 365/233; 365/189.01; 365/189.05
(58) Field of Search ........................... 365/233, 230.02, 365/233.5, 189.01, 189.02, 189.05

(56) References Cited

U.S. PATENT DOCUMENTS 5,706,232 A * 1/1998 McClure et al. ............ 365/195
6,246,614 B1 * 6/2001 Ooshi ......................... 365/191
6,252,448 B1 * 6/2001 Schober ...................... 327/259

FOREIGN PATENT DOCUMENTS

JP  11-213696  8/1999

* cited by examiner

Primary Examiner—David Nelms
Assistant Examiner—Thong Le
(74) Attorney, Agent, or Firm—McGinn & Gibb, PLLC

(57) ABSTRACT

A synchronous DRAM has a latch circuit for latching read data in a normal operation mode to output the read data at a specified timing. A clock signal generator generates a pair of operational clock signals used in the normal operation mode as well as a doubled-frequency clock signal used in a test mode. A bypass circuit bypasses the latch circuit during a burn-in test of the DRAM, and the read data is output from the DRAM at a doubled rate during the test mode.

6 Claims, 9 Drawing Sheets

SYNCHRONOUS SEMICONDUCTOR MEMORY DEVICE

BACKGROUND OF THE INVENTION

1. Field of the Invention

The present invention relates to a synchronous semiconductor memory device, and more particularly to a synchronous semiconductor memory device such as synchronous dynamic RAM in which read and write operations can be performed based on a pair of complementary clock signals.

2. Description of the Related Art

Synchronous semiconductor memory devices are increasingly used for raising the operational speed of the memory devices. Since semiconductor memory devices have also become increasingly greater in memory capacity, there is a tendency that subjecting semiconductor memory devices to dynamic burn-in tests leads to longer test times. In addition, burn-in test systems used for the burn-in test generally includes respective oscillators that cannot meet the high operational speeds of the memory devices, or DUTs (devices under test). To be more specific, the clock frequencies that can be used in the dynamic burn-in tests on semiconductor memory devices are limited. Thus, a reduction in test time requires some contrivance to increase the operational frequencies used inside the semiconductor memory devices during the burn-in test.

FIGS. 1A to 1C show the configuration and operational timing chart of a dynamic RAM (DRAM) described in Japanese Patent Laid-Open Publication No. Hei 11-213696. FIG. 1A is a block diagram of the dynamic RAM. In the drawing, /RAS1 and /CAS1, for example, represents top-barred RAS1 and top-barred CAS1, respectively. More specifically, "/RAS1" and "CAS1" signals represent a specific row address strobe and a specific column address strobe, both of which are active at the low level thereof. The /RAS1 signal and the /CAS1 signal are input to the dynamic RAM through an n-type transfer gate pair 81 and input buffers 82 and 83. An address key is input to the dynamic RAM through an address key detection circuit 89. The dynamic RAM controls its memory array based on the /RAS1 and /CAS1 signals. The operational mode of the dynamic RAM is set at either one of normal operation mode and test mode, based on the address key.

In the normal operation mode, the address key detection circuit 89 inputs a low level signal to a P-type transfer gate pair 84 and an N-type transfer gate pair 81. The /RAS1 signal is input to a memory array control circuit 87 through the input buffer 82, the P-type transfer gate 84, and a row address decoder 85. The /CAS1 signal is input to the memory array control circuit 87 through the input buffer 83, the P-type transfer gate 84, and a column address decoder 86.

In the test mode, the address key detection circuit 89 inputs a high level signal to the P-type transfer gate pair 84 and the N-type transfer gate pair 81. The /RAS1 and /CAS1 signals are input to a logic circuit 88 through the N-type transfer gate 81.

FIG. 1B is a circuit diagram showing the configuration of the logic circuit 88. The logic circuit 88 generates a /RAS2 signal based on the /RAS1 and /CAS1 signals through an exclusive-NOR gate (hereinafter, referred to as an EXNOR gate) 90. From this /RAS2 signal, the logic circuit 88 generates a /CAS2 signal through a delay circuit 91. The /RAS2 signal and the /CAS2 signal are input to the memory array control circuit 87 through the row address decoder 85 and the column address decoder 86, respectively.

FIG. 1C is a timing chart showing the operation of the logic circuit 88. The /RAS1 and /CAS1 signals have a period of 2 μs.

The rise and fall of the /RAS1 signal lag a predetermined time length behind the rise and fall, respectively, of the /CAS1 signal. The /RAS2 signal traces a waveform having a pulse width of a predetermined time length. The delay circuit 91 delays the input /RAS2 signal by 20 ns to generate the /CAS2 signal. The /RAS2 and /CAS2 signals have a period of 1 μs.

The technology described in the aforementioned publication is such that a conventional burn-in test system is used to reduce the period of the internal clock for reduced test times in the dynamic burn-in tests. In this technology, if the read speed of the dynamic RAM in the test mode is twice that in the normal operation mode, the burn-in test system requires a circuit that can meet the doubled read speed, to compare the read data against the write data for PASS/FAIL evaluation, This raises the cost of the dynamic burn-in test device, and thereby raises the cost for the dynamic RAM.

SUMMARY OF THE INVENTION

In view of the foregoing problem in the conventional technology, it is an object of the present invention to provide a synchronous semiconductor memory device having an operational speed in the test mode, which is twice compared to the operational speed in the normal mode to thereby facilitate the PASS/FAIL evaluation in a dynamic burn-in test of the semiconductor memory device.

The present invention provides a synchronous semiconductor memory device including: a memory cell array including a plurality of groups of memory cells, each of the groups including m memory cells for storing m bits of data; a clock signal generator for receiving a pair of complementary signals including first and second clock signals to generate third and fourth clock signals in a normal operation mode, the third clock signal having a rise time substantially in synchrony with a fall time of the first clock signal, the fourth clock signal having a rise time substantially in synchrony with a rise time of the first clock signal, the clock signal generator generating in a test mode a fifth clock signal having a frequency which is double a frequency of the first clock signal; a read/write control circuit for responding to the first clock signal in the normal operation mode to control a read/write operation for the memory cells, the read/write control circuit responding to the fifth clock signal in the test mode to control a read/write operation for the memory cells; a plurality of data latches each disposed for a corresponding one of the m bits, each of the data latches responding to the third and fourth clock signals in the normal operation mode to latch read data from a corresponding one of the memory cells in synchrony with the third clock signal and delivering the latched read data in synchrony with the fourth clock signal; and a bypass circuit for responding to the fifth clock signal to allow the read data to bypass the data latches during the test mode.

According to the synchronous semiconductor memory device of the present invention, the read/write control circuit operates in synchrony with the doubled signal and the bypass circuit bypasses the latches at the read operation in the test mode. This makes it possible to double the operational speed in the test mode without increasing the operational frequency of the burn-in test device The above and other objects, features and advantages of the present invention will be more apparent from the following description, referring to the accompanying drawings.

DETAILED DESCRIPTION OF THE PREFERRED EMBODIMENT

Figure 2:
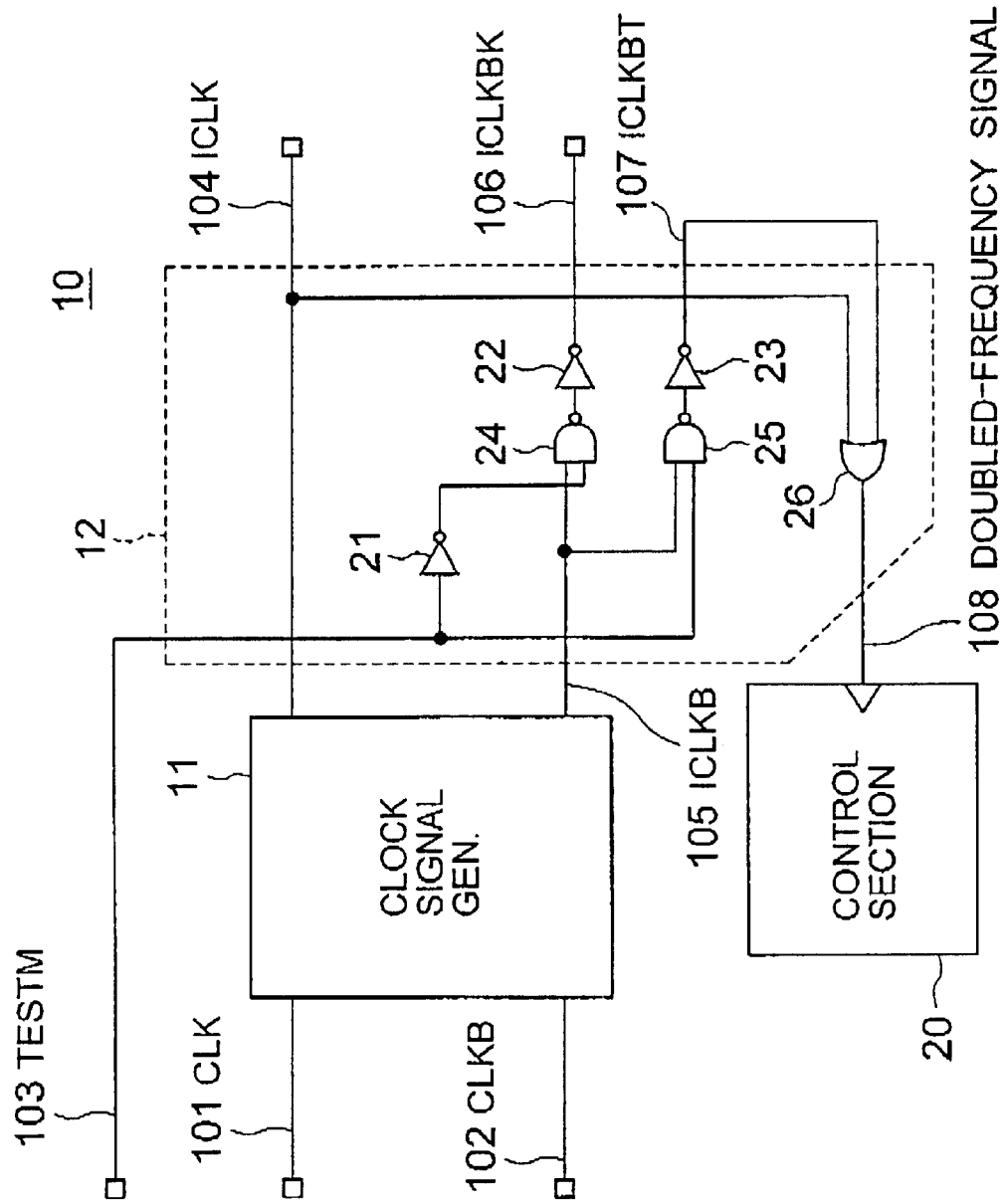
FIG. 2 is a circuit diagram of a synchronous Semiconductor memory device according to an embodiment of the present invention.

Hereinafter, the synchronous semiconductor memory device of the present invention will be described in conjunction with the embodiment of the present invention and with reference to the drawings. Referring to FIG. 2, a synchronous semiconductor memory device according to an embodiment of the present invention, generally designated by numeral 10, includes a clock signal generator 11, a control signal generator (another clock signal generator) 12, and a control section 20 including a read/write control circuit. The control signal generator 12 includes inverters 21 to 23, NAND gates 24 and 25, and an OR gate 26. The synchronous semiconductor memory device receives a pair of complementary clock signals, CLK signal 101 and CLKB signal 102 which are necessary for write and read operations, and a mode switching signal, TESTM signal 103, having a signal level which determines the operational mode of the memory device.

The clock signal generator 11 generates a first internal clock signal, ICLK signal 104, based on the CLK signal 101, and delivers the same to a first input of the OR gate 26. It also generates a second internal signal, ICLKB signal 105, based on the CLKB signal 102, and delivers the same to first inputs of both the NAND gates 24 and 25. The TESTM signal 103 is input to a second input of the NAND gate 24 through the inverter 21, and to a second input of the NAND gate 25 as well. The NAND gate 24 outputs a control signal, ICLKBK signal 106, through the inverter 22. The NAND gate 25 inputs a control signal, ICLKJBT signal 107, to a second input of the OR gate 26 through the inverter 23. The OR gate 26 synthesizes the ICLK signal 104 and the ICLKBT signal 107 into a doubled-frequency signal 108, and delivers the same to the clock input of the control section 20. In synchrony with the doubled-frequency signal 108 to be used as the operating clock, the control section 20 controls the overall operation of the synchronous semiconductor memory device.

Figure 3:
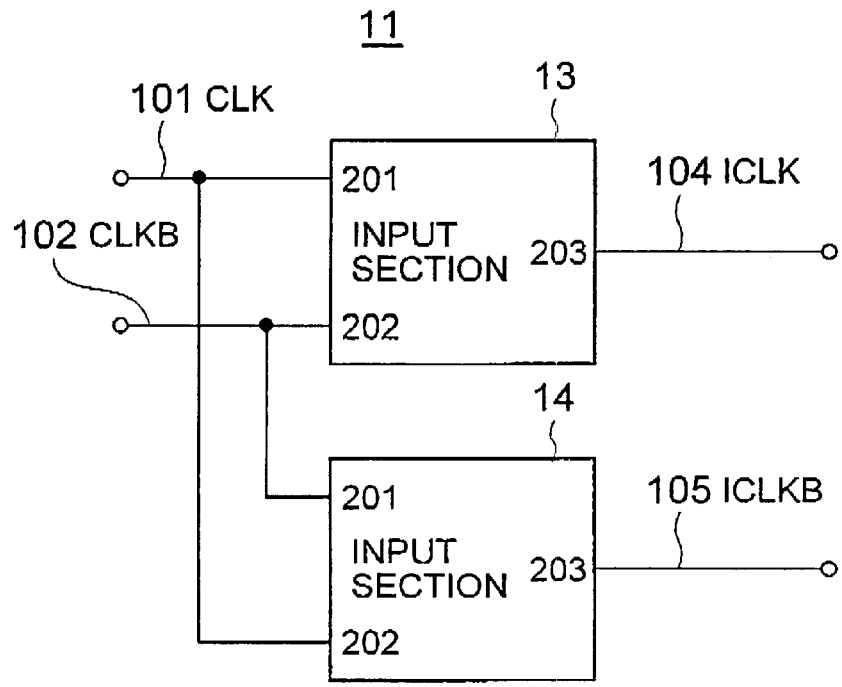
FIG. 3 is a block diagram showing a first example of the clock signal generator 11 in FIG. 1.

Referring to FIG. 3, a first example of the clock signal generator 11 in FIG. 2 includes input sections 13 and 14, which are a pair of functional circuit blocks having the same circuit configuration. The CLK signal 101 is input to an input terminal 201 of the input section 13 and an input terminal 202 of the input section 14. The CLKB signal 102 is input to an input terminal 202 of the input section 13 and an input terminal 201 of the input section 14. The ICLK signal 104 is output from the output terminal 203 of the input section 13. The ICLKB signal 105 is output from the output terminal 203 of the input section 14.

Figure 4:
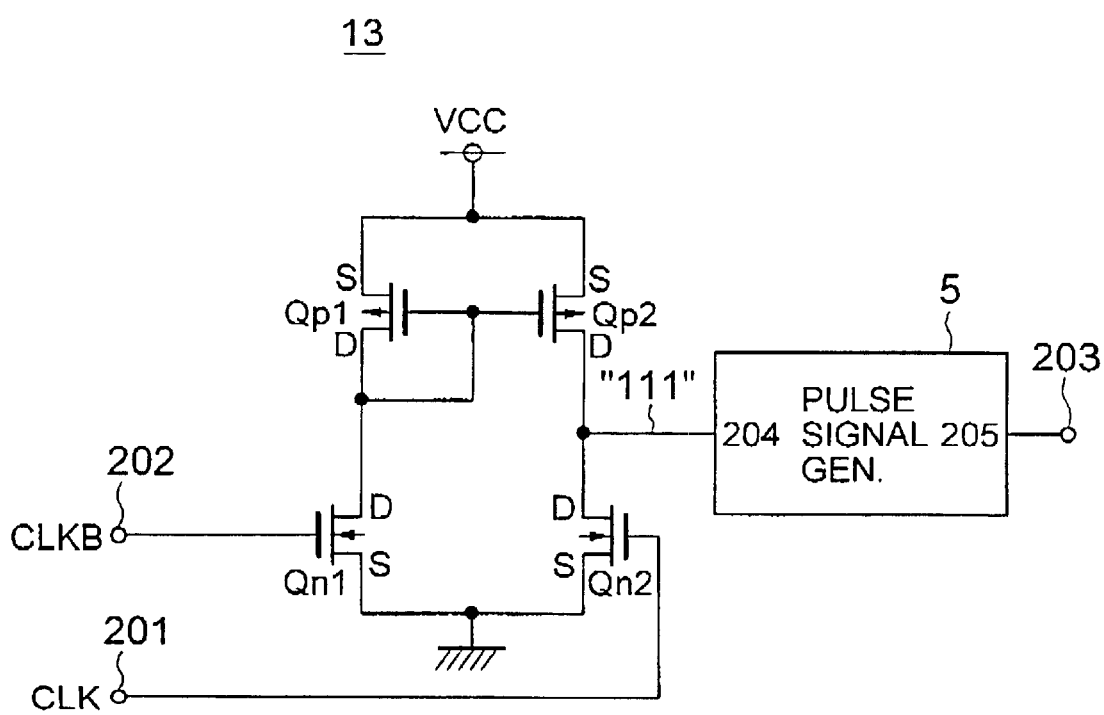
FIG. 4 is a circuit diagram showing a concrete example of the input sections 3 and 4 in FIG. 2.

Referring to FIG. 4, a concrete example of the input section 13 shown in FIG. 3, which is similar to the input section 14 in the configuration thereof, includes P-channel MOS transistors Qp1 and Qp2, N-channel MOS transistors Qn1 and Qn2, and a pulse signal generator 15. The MOS transistors Qp1 and Qp2 both are connected to a power supply lines VCC at their sources, and to the drain of the MOS transistor Qp1 at their gates. The MOS transistor Qn1 is connected at its drain to the drain of the modulator transistor Qp1, and at its gate to the input terminal 202 of the input section 13 or 14. The MOS transistor Qn2 is connected at its drain to the drain of the MOS transistor Qp2 and the input terminal 204 of the pulse signal generator 15, and at its gate to the input terminal 201 of the input section 13 or 14. The output terminal 205 of the pulse signal generator 15 is connected to the output terminal 203 of the input section 13 or 14. The MOS transistors Qn1 and Qn2 both are grounded at their sources.

Figure 5:
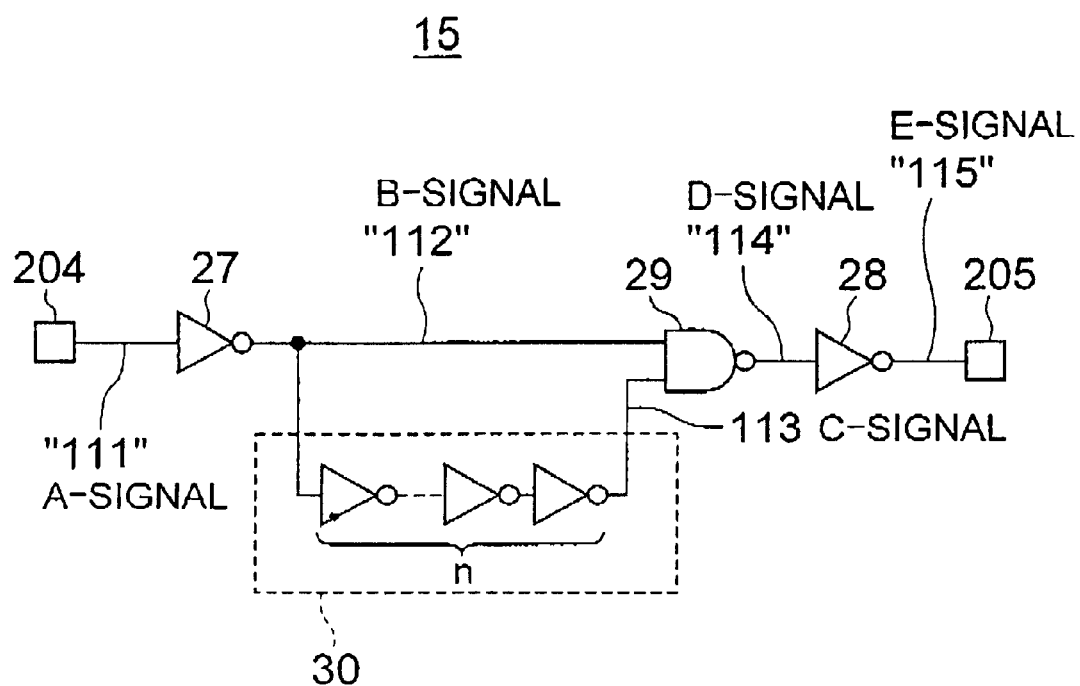
FIG. 5 is a circuit diagram showing a concrete example of the pulse signal generator 15 in FIG. 3.

Referring to FIG. 5, a concrete example of the pulse signal generator 15 shown in FIG. 3 includes inverters 27 and 28, a NAND gate 29, and a delay unit 30 having an odd number (n) of cascaded inverters. The inverter 27 receives an A-signal 111 from the input terminal 204 of the pulse signal generator 15, and delivers a B-signal 112 to a first input of the NAND gate 29 and the input terminal of the delay unit 30. The delay unit 30 delivers a C-signal 113 to a second input of the NAND gate 29. The NAND gate 29 delivers a D-signal 114 to the inverter 28, which delivers an E-signal 115 to the output terminal 205 of the pulse signal generator 15.

Figure 6:
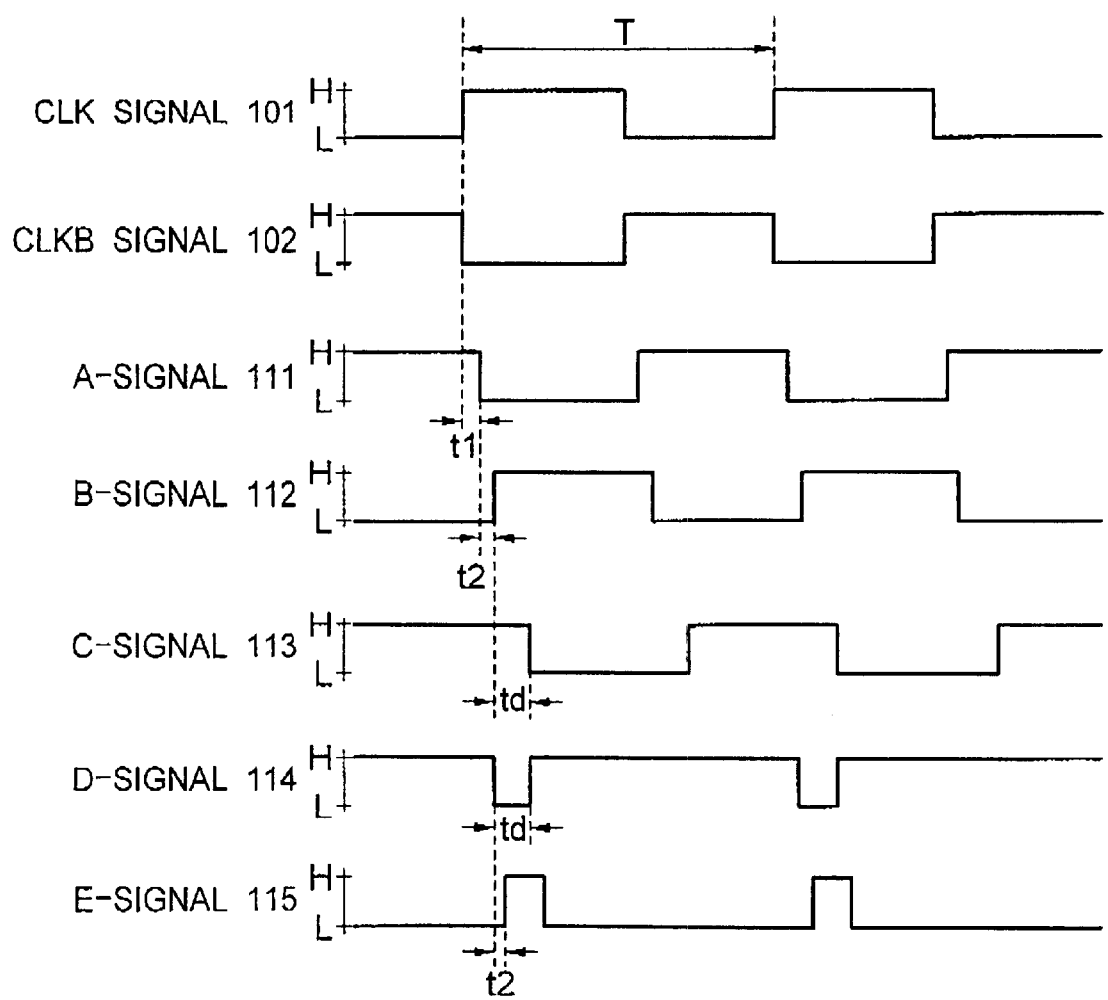
FIG. 6 is a timing chart of signals, showing the operation of the input section 13 in FIG. 2.

Referring to FIG. 6, there is shown a timing chart illustrating the operation of the input section 13 shown in FIG. 3. The CLK signal 101 is a clock signal having a period T. The CLKB signal 102 is the complementary signal of the CLK signal 101. As shown in FIGS. 3 to 5, when the CLK signal 101 assumes a low level, the input section 13 allows the MOS transistors Qn1, Qp1, and Qp2 to turn on and the MOS transistor Qn2 to turn off, whereby the A-signal 111 on the input of the inverter 27 in FIG. 5 rises to a high level, On the other hand, when the CLK signal 101 assumes a high level, the MOS transistors Qn1, Qp1, and Qp2 are turned off and the MOS transistor Qn2 is turned on, thereby allowing the A-signal 111 to assume a low level.

The A-signal 111 falls with a delay time t1, which corresponds to a single logic gate, behind the rise of the CLK signal 101 depending on the operations of the most transistors Qn1, Qp1 and Qp2. Thus, the B-signal 112 on the output of the inverter 27 rises with a delay time t2, which corresponds to a single logic gate, behind the fall of the A-signal 111. Due to the function of the delay unit 30, the C-signal 113 on the output of the delay unit 30 falls with a delay time td, which corresponds to n stages of inverters, behind the rise of the B-signal 112. The D-signal 114, which is a NAND of the B-signal 112 and the C-signal 113, is of a one-shot pulse having a low level and a pulse width of td. The E-signal 115 on the output of the inverter 28 rises with a delay time t2, which corresponds to a single logic gate, behind the fall of the D-signal 114.

Figure 1A:
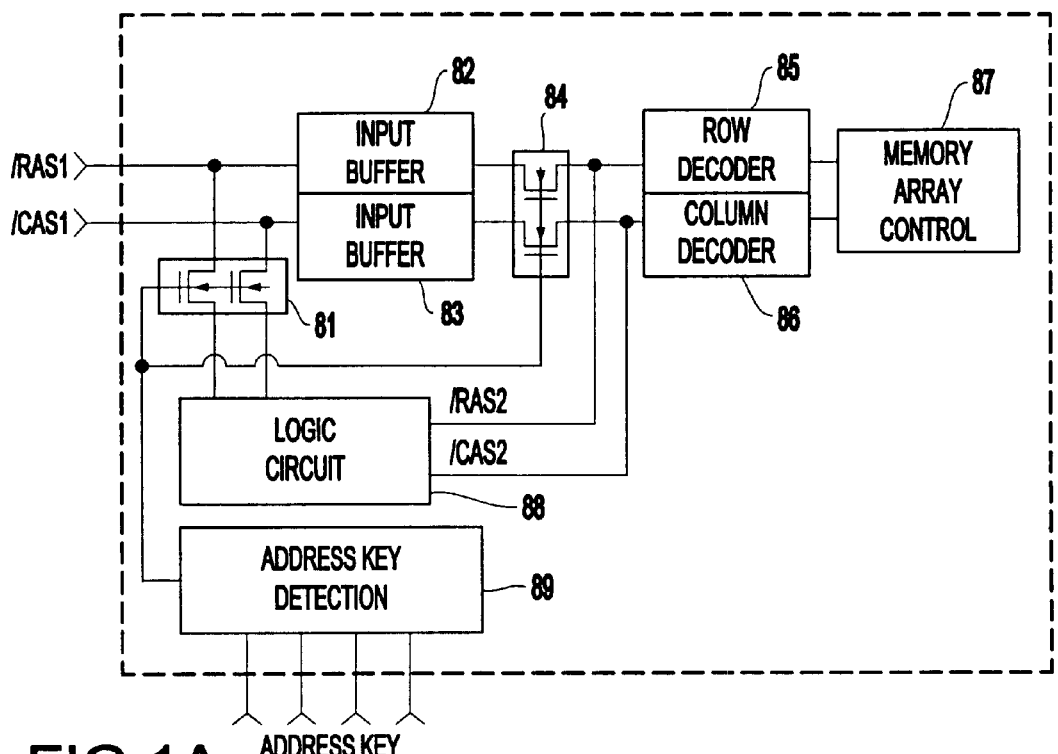
FIGS. 1A to 1C are diagrams showing the configuration and operational timing chart of a conventional dynamic RAM.
Figure 1B:
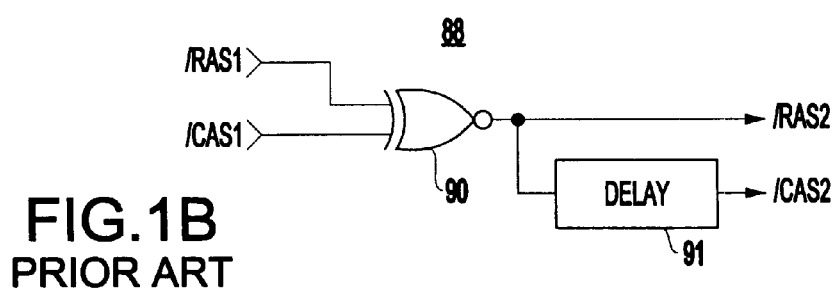
Figure 1C:
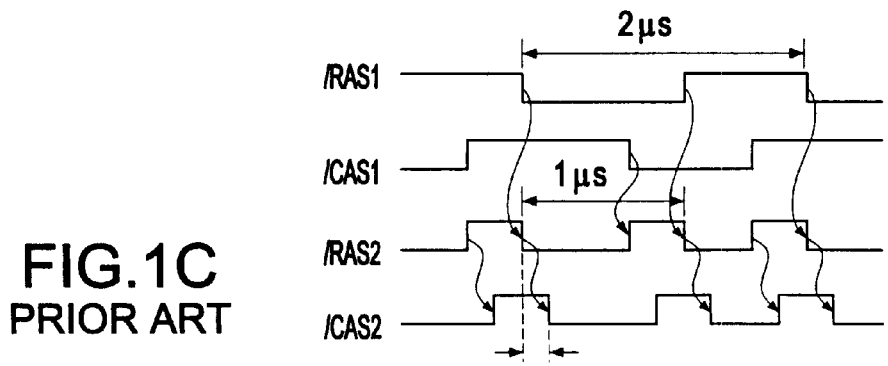
Figure 7:
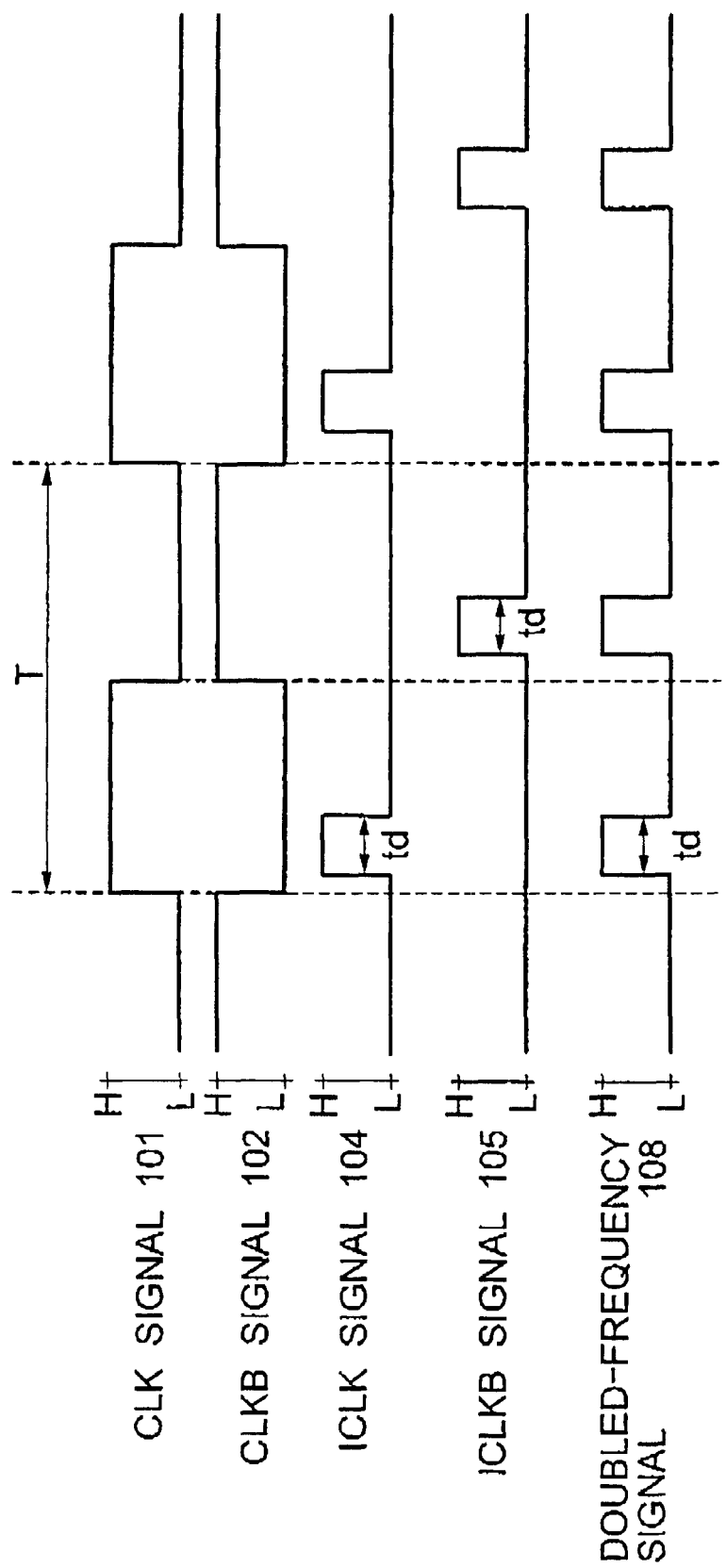
FIG. 7 is a timing chart of signals, showing the operation of the clock signal generator 11 in FIG. 2.

Referring to FIG. 7, there is shown a timing chart illustrating the operation of the clock signal generator 11 in FIG. 1. The clock signal generator 11 generates a one-shot pulse as the ICLK signal 104 after a lapse of predetermined time since the rise of the CLK signal 101. It also generates a one-shot pulse having a high level as the ICLKB signal 105 after a lapse of a predetermined time length since the rise of the CLKB signal 102.

The TESTM signal 103 is set at a low level in the normal operation mode, and at a high level in the test mode. In the normal operation mode, the ICLKB signal 105 passes the NAND gate 24 and the inverter 22 as the ICLKBK signal 106, whereas the ICLKBT signal 107 is maintained at a low level. In the test mode, the ICLKBK signal 106 is maintained at a low level, whereas the ICLKB Signal 105 passes the NAND gate 25 and the inverter 23 as the ICLKBT signal. The doubled-frequency signal 108 is an OR of the ICLK signal 104 and the ICLKBT signal 107, and has a pulse width of td. The doubled-frequency signal 108 has a single one-shot pulse at every period T in the normal operation mode, and at every period T/2 in the test mode.

Figure 8:
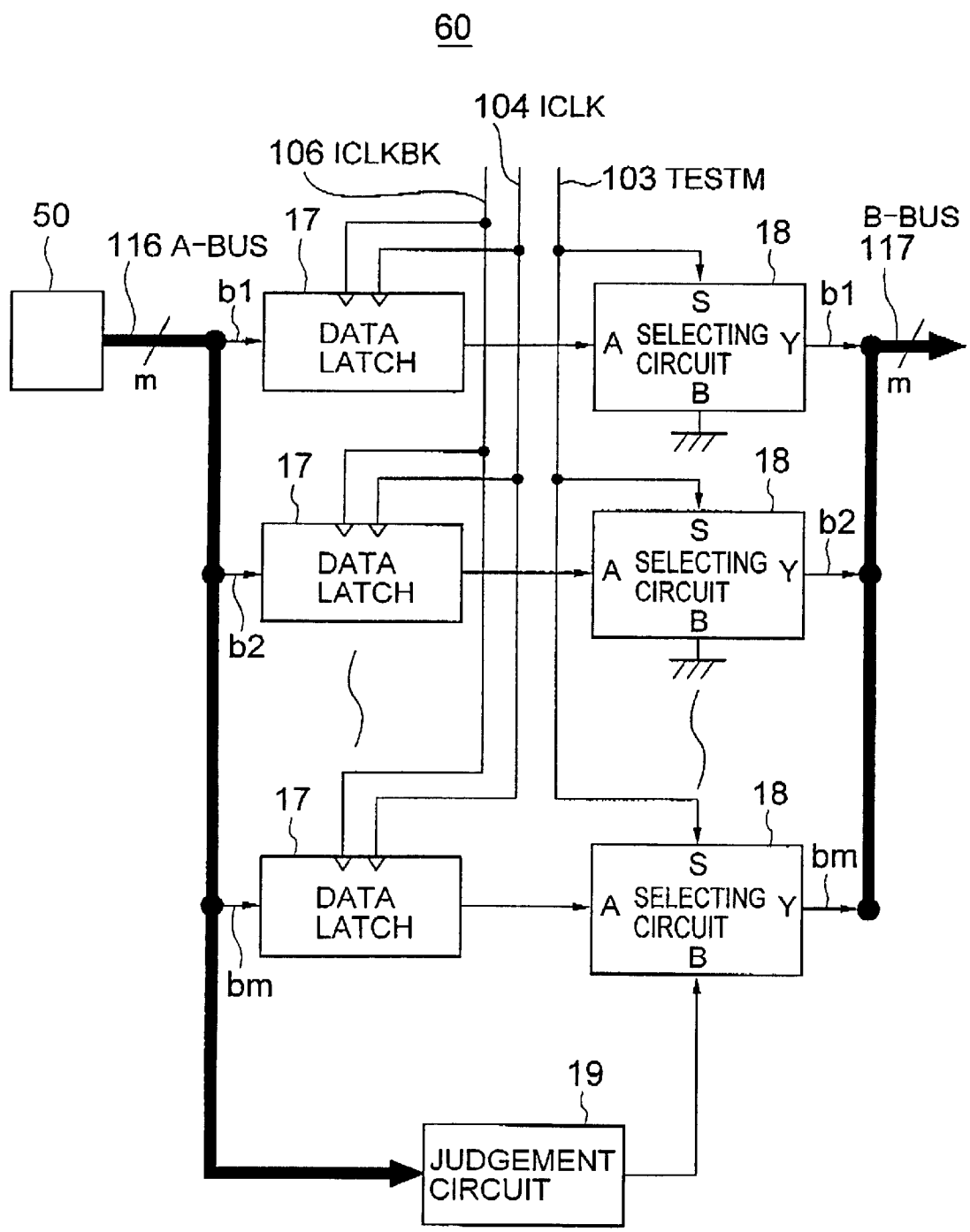
FIG. 8 is a block diagram showing an example of the read circuit in the synchronous semiconductor memory device of FIG. 2.

Referring to FIG. 8, there is shown an example of a read circuit in the synchronous semiconductor memory device of FIG. 2. The read circuit, generally designated by numeral 60, includes a plurality of (m) data latches 17 and m selecting circuits 18, which is controlled by a judgement circuit 19 implemented as a bypass circuit. The read data is supplied to the read circuit 60 from a group of memory cells in the memory cell array 50 through an A-data bus 116, and delivered from the read circuit 60 through a B-data bus 117, Each of the A-data bus and B-data bus includes m signal lines which correspond to the number of bits of data including the least significant bit, or a first bit b1, through the most significant bit, or an m-th bit bm. The judgement circuit 19 includes an m-input ExNOR gate.

Each of the signal lines corresponding to the bits b1 to bm of is the A-data bus 116 is connected to the data input of a corresponding data latch circuit 17 and to a corresponding input of the ExNOR gate in the judgement circuit 19. All the m data latches 17 receive the ICLKBK signal 106 at their first clock inputs and the ICLK signal 104 at their second clock inputs. Each of the data outputs of the m data latches 17 is connected to the A-input of a corresponding selecting circuit 18. All the m selecting circuits 18 receive the TESTM signal 103 at their S-inputs, which acts as an input for the selection control signal. The B-input of one of the selecting circuits 18 corresponding to the m-th bit bm of data is connected to the output of the ExNOR gate in the judgement circuit 19. The B-inputs of the selecting circuits 18 corresponding to the bits bm-1 to b1 are grounded. The Y-output terminals of the selecting circuits 18 corresponding to the bits bm to b1 are connected to the respective signal lines on the B-data bus 117.

Figure 9:
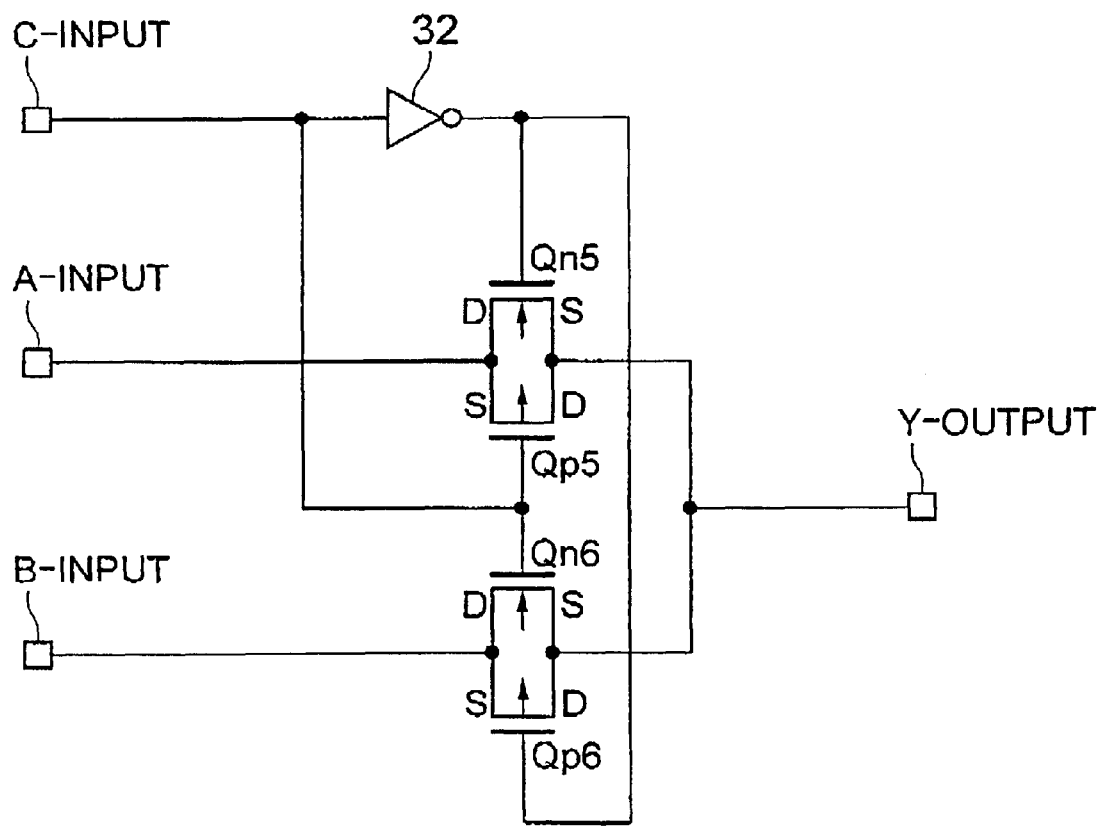
FIG. 9 is a circuit diagram showing an example of the selecting circuits 8 in FIG. 8.

Referring to FIG. 9, an example of the selecting circuits 18 shown in FIG. 8 includes P-channel MOS transistors Qp5 and Qp6, N-channel MOS transistors Qn5 and Qn6, and an inverter 32.

The S-input of the selecting circuit 18 is connected to the input of the inverter 32, the gate of the MOS transistor Qp5, and the gate of the MOS transistor Qn6. The A-input of the selecting circuit 18 is connected to both the drain of the MOS transistor Qn5 and the source of the MOS transistor Qp5. The B-input of the selecting circuit 18 is connected to both the drain of the MOS transistor Qn6 and the source of the MOS transistor Qp6 The output of the inverter 32 is connected to both the gate of the MOS transistor Qn5 and the gate of the MOS transistor Qp6. The source of the MOS transistor Qn5, the drain of the MOS transistor Qp5, the source of the MOS transistor Qn6, and the drain of the MOS transistor Qp6 all are connected to the Y-output terminal of the selecting circuit 18

When the signal fed to the S-input terminal assumes a low level, the selecting circuit 18 allows the MOS transistors Qn5 and Qp5 to turn on and the MOS transistors Qn6 and Qp6 to turn off, whereby connection is established between the A-input terminal and the Y-output terminal. When the signal fed to the S-input terminal assumes a high level, the MOS transistors Qn5 and Qp5 are turned off and the MOS transistors Qn6 and Qp6 are turned on, establishing connection between the B-input terminal and the Y-output terminal.

For example, in a write operation of a synchronous DRAM, implemented as an example of the semiconductor memory device of the present embodiment, write data input from outside the synchronous DRAM is stored into memory cells immediately in synchrony with the operating clock. In a read operation of the synchronous DRAM, read data read from memory cells are latched and delivered to outside the DRAM a few clocks later in synchrony with the operating clock. The synchronous semiconductor memory device performs its read and write operations in the test mode, when the TESTM signal 103 is set at a high level, in a burn-in test with the operating clock doubled in frequency, as compared with the normal operation mode at which the TESTM signal 103 is set at a low level.

The read data from the memory cells are input to both the data latches 17 and the judgement circuit 19 through the A-data bus 116. In the normal operation mode, the m data latches 17 latch the read data in synchrony with the ICLK signal 104 and the ICLKBK signal 106, and deliver the same to the A-input terminals of the selecting circuits 18 after a few clocks. The selecting circuits 18 deliver all the bits bm to bt of the read data to the B-data bus 117.

In the test mode, the judgement circuit 19 delivers the result of judgement based on the read data to the selecting circuit 18 that corresponds to the m-th bit bm of the data. The selecting circuit 18 corresponding to the m-th bit bm of the data delivers the result of judgement to signal line of the 8-data bus 117 corresponding to the m-th bit bm. The selecting circuits 18 corresponding to the bits bm-1 to b1 of the data turn the respective signal lines of the B-data bus 117 to a low level.

Now, description will be given of the burn-in test to be performed on the synchronous semiconductor memory device having the read circuit of FIG. 8. The burn-in test system writes data having contiguous "0"s or "1"s across the entire bits into memory cells. Next, the burn-in test system turns the TFSTM signal 103 to a high level, thereby allowing the synchronous semiconductor memory device to operate in the test mode. The synchronous semiconductor memory device then reads the data from the memory cells and examines the value of the m-th bit Bm on the B-data bus 117.

If all the bits of the read data have the same value, the value of the m-th bit bm on the B-data bus 117 assumes "1". If the bits of the read data have different values, the value of the m-th bit bm on the B-data bus 117 assumes "0". The burn-in test system judges "PASS" when the m-th bit bm on the B data bus 117 assumes "1," and judges "FAIL" when the m-th bit bm on the B-data bus 117 assumes "0."

It is to be noted that the judgement circuit 19 may include switches and inverters interposed between the inputs of the ExNOR gate and the respective signal lines of the A-data bus 116.

The signal lines of the A-data bus 116 are connected to first inputs of the respective switches and the inputs of the respective inverters. The outputs of the inverters are connected to second inputs of the respective switches. The inputs of the ExNOR gate are then connected to the outputs of the respective switches.

Based on instructions supplied from outside the memory device, the switches allow either of their first and second inputs to be in connection with their outputs so as to correspond the expected values, i.e., the write data. In this case, any expected values can be used as the write data, with an improvement in the reliability of the burn-in test.

According to the embodiment described above, the synchronous semiconductor memory device uses the doubled-frequency signal as the operating clock of its control circuit while performing write operations, read operations, and comparison and judgement operations. The read circuit bypasses the latches when the judgement circuit judges the test mode. This makes it possible to double the operational speed in the test mode.

Figure 10:
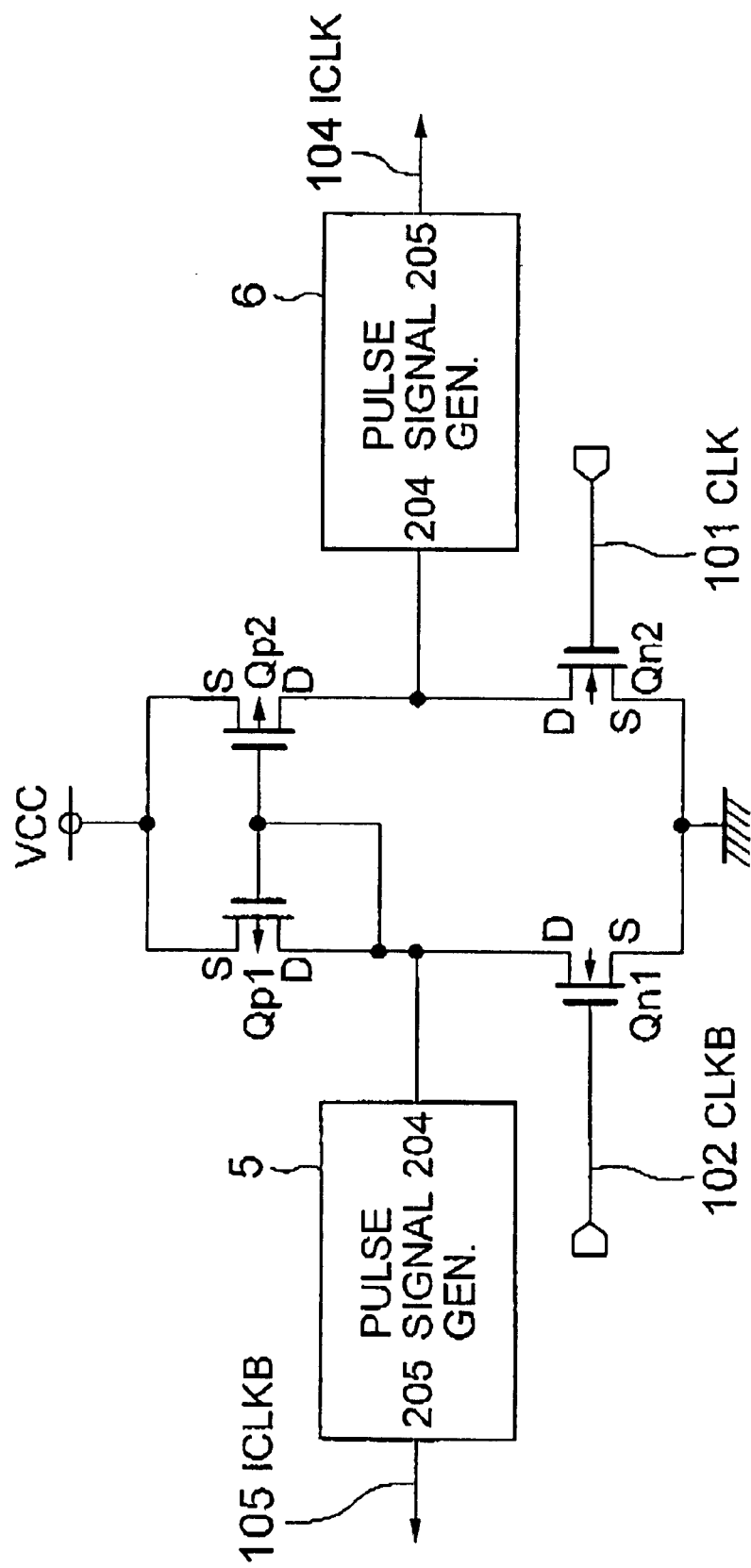
FIG. 10 is a block diagram showing a second concrete example of the clock signal generator 11 in FIG. 2.

Referring to FIG. 10, a second concrete example of the clock signal generator 11 shown in FIG. 2 includes a single input section, instead of the two input sections 13 and 14. The clock signal generator 11A includes P-channel MOS transistors Qp1 and Qp2, N-channel MOS transistors Qn1 and Qn2, and two pulse generators 15 and 16.

The drain and gate of the MOS transistor Qp1 and the drain of the MOS transistor Qn1 are connected to the input terminal 204 of the pulse signal generator 15. The drain of the MOS transistor Qp2 and the drain of the MOS transistor Qn2 are connected to the input terminal 204 of the pulse generator 16. The pulse signal generator 15 delivers the ICLKB signal 105 from its output terminal 205. The pulse generator 16 delivers the ICLK signal 104 from its output terminal 205. In this case, the circuit scale can be reduced.

The present invention has been described in conjunction with the preferred embodiment thereof. The synchronous semiconductor memory device according to the present invention is, however, not limited to the configuration of the embodiment described above. Synchronous semiconductor memory devices obtained through various modifications or alterations to the configuration of the above-described embodiment also fall within the scope of the present invention.

What is claimed is:

1. A synchronous semiconductor memory device comprising:
   a memory cell array including a plurality of groups of memory cells, each of said groups including m memory cells for storing m bits of data;
   a mode selecting section for selecting a normal operation mode or a test mode for said memory device;
   a clock signal generator for receiving a pair of complementary signals including first and second clock signals to generate third and fourth clock signals in said normal operation mode, said third clock signal having a rise time substantially in synchrony with a fall time of said first clock signal, said fourth clock signal having a rise time substantially in synchrony with a rise time of said first clock signal, said clock signal generator generating in said test mode a fifth clock signal having a frequency which is double a frequency of said first clock signal;
   a read/write control circuit for responding to said first clock signal in said normal operation mode to control a read/write operation for said memory cells, said read/write control circuit responding to said fifth clock signal in said test mode to control a read/write operation for said memory cells;
   a plurality of data latches each disposed for a corresponding one of said m bits, each of said data latches responding to said third and fourth clock signals in said normal operation mode to latch read data from a corresponding one of said memory cells in synchrony with said third clock signal and delivering said latched read data in synchrony with said fourth clock signal; and
   a bypass circuit for responding to said fifth clock signal to allow said read data to bypass said data latches during said test mode.

2. The synchronous semiconductor memory device as defined in claim 1, wherein said bypass circuit includes an exclusive NOR gate having m inputs corresponding to said m bits.

3. The synchronous semiconductor memory device as defined in claim 2, wherein said bypass circuit further includes a plurality of selecting circuits each disposed for a corresponding one of said data latches to pass an output of said corresponding one of said data latches in said normal operation mode.

4. The synchronous semiconductor memory device as defined in claim 3, further including at least one inverter disposed between one of said memory cells an d a corresponding input of said exclusive NOR gate.

5. A synchronous memory device having an internal test circuit, said device comprising:
   a memory cell array comprising a plurality of memory cells;
   a frequency multiplier circuit to increase a clock frequency of said synchronous memory device during a test mode; and
   a comparator to determine during said test mode whether a test signal result from said plurality of memory cells comprises an expected result.

6. A method of increasing a testing of a synchronous memory device having a memory cell array comprising a plurality of memory cells, said method comprising;
   increasing a clock frequency of said synchronous memory device during a test mode, said increase of said clock frequency caused by a frequency multiplier circuit incorporated in said synchronous memory device; and
   determining during said test mode whether a test signal result from said plurality of memory cells comprises an expected result, said determination made by a comparator circuit incorporated in said synchronous memory device.

* * * * *